United States Patent
Schuderer et al.

(10) Patent No.: US 12,512,413 B2
(45) Date of Patent: Dec. 30, 2025

(54) ELECTRICAL CONTACT ARRANGEMENT, POWER SEMICONDUCTOR MODULE, METHOD FOR MANUFACTURING AN ELECTRICAL CONTACT ARRANGEMENT AND METHOD FOR MANUFACTURING A POWER SEMICONDUCTOR MODULE

(71) Applicant: Hitachi Energy Ltd, Zurich (CH)

(72) Inventors: Juergen Schuderer, Zurich (CH); Fabian Mohn, Ennetbaden (CH); Chunlei Liu, Oberrohrdorf (CH); Joonas Puukko, Tuusula (FI)

(73) Assignee: HITACHI ENERGY LTD, Zurich (CH)

( * ) Notice: Subject to any disclaimer, the term of this patent is extended or adjusted under 35 U.S.C. 154(b) by 473 days.

(21) Appl. No.: 18/026,953

(22) PCT Filed: Nov. 23, 2021

(86) PCT No.: PCT/EP2021/082671
§ 371 (c)(1),
(2) Date: Mar. 17, 2023

(87) PCT Pub. No.: WO2022/106721
PCT Pub. Date: May 27, 2022

(65) Prior Publication Data
US 2023/0343715 A1 Oct. 26, 2023

(30) Foreign Application Priority Data
Nov. 23, 2020 (EP) .................................... 20209225

(51) Int. Cl.
*H01L 23/538* (2006.01)
*H01L 23/00* (2006.01)
*H01L 23/373* (2006.01)

(52) U.S. Cl.
CPC ...... *H01L 23/5385* (2013.01); *H01L 23/3735* (2013.01); *H01L 24/48* (2013.01);
(Continued)

(58) Field of Classification Search
None
See application file for complete search history.

(56) References Cited

U.S. PATENT DOCUMENTS 8,593,817 B2 11/2013 Bayerer et al.
2002/0113302 A1* 8/2002 Shinohara ......... H01L 23/49575
257/E23.092

(Continued)

FOREIGN PATENT DOCUMENTS

CN 202353931 U 7/2012
EP 0427143 A3 5/1991
(Continued)

OTHER PUBLICATIONS

Bayer et al., "Electrochemical Corrosion on Ceramic Substrates for Power Electronics—Causes, Phenomenological Description, and Outlook", CIPS 2018—10th International Conference on Integrated Power Electronics Systems, © 2018 VDE VERLAG GMBH • Berlin • Offenbach, ISBN 978-3-8007-4540-1, p. 161-167.

(Continued)

*Primary Examiner* — Cory W Eskridge
(74) *Attorney, Agent, or Firm* — Procopio, Cory, Hargreaves & Savitch LLP (57) ABSTRACT

An electrical contact arrangement electrically contacts at least two power semiconductor devices, and comprises at least two bond wires and at least three electrical contacts, comprising an alternating current contact, a positive direct current contact, and a negative direct current contact. Each electrical contact comprises a ground potential part; contact part; and insulation part on the ground potential part. The
(Continued)

contact part is provided on the insulation part. At least two electrical contacts are separated by a gap between the insulation parts and the gap between the contact parts of the separated electrical contacts. A bond wire connects a first power semiconductor device on a contact part of the positive direct current contact with a contact part of the alternating current contact. A bond wire connects a second power semiconductor device on the contact part of the alternating current contact with a contact part of the negative direct current contact.

20 Claims, 2 Drawing Sheets

(52) U.S. Cl.
CPC .... *H01L 24/73* (2013.01); *H01L 2224/48091* (2013.01); *H01L 2224/48227* (2013.01); *H01L 2224/73265* (2013.01)

(56) References Cited

U.S. PATENT DOCUMENTS

| | | |
|---|---|---|
| 2010/0078782 A1 | 4/2010 | Mengel et al. |
| 2011/0075451 A1 | 3/2011 | Bayerer et al. |
| 2013/0043593 A1* | 2/2013 | Domes ............... H01L 23/3735 257/E23.168 |
| 2014/0138834 A1 | 5/2014 | Pritiskutch et al. |
| 2018/0174936 A1 | 6/2018 | Bayerer |

FOREIGN PATENT DOCUMENTS

| | | |
|---|---|---|
| EP | 3113223 A1 | 1/2017 |
| FR | 2786657 A1 | 6/2000 |
| FR | 2817397 A1 | 5/2002 |
| JP | 2014-67821 A | 4/2014 |
| WO | 2016/150583 A1 | 9/2016 |

OTHER PUBLICATIONS

Krumbein, "Metallic Electromigration Phenomena", AMP Incorporated, Harrisburg, Pennsylvania, Presented at the 33rd Meeting of the IEEE Holm Conference on Electrical Contacts, Chicago, IL, Sep. 21-23, 1987, P313-89.

* cited by examiner

ELECTRICAL CONTACT ARRANGEMENT, POWER SEMICONDUCTOR MODULE, METHOD FOR MANUFACTURING AN ELECTRICAL CONTACT ARRANGEMENT AND METHOD FOR MANUFACTURING A POWER SEMICONDUCTOR MODULE

CROSS-REFERENCE TO RELATED APPLICATIONS

The present application is a national stage entry of International Patent Application No. PCT/EP2021/082671, filed on Nov. 23, 2021, which claims priority to European Patent Application No. 20209225.0, filed on Nov. 23, 2020, which are both hereby incorporated herein by reference as if set forth in full.

TECHNICAL FIELD

The invention relates to an electrical contact arrangement for electrically contacting at least one power semiconductor device of a power semiconductor module, the electrical contact arrangement comprising multiple electrical contacts. The present invention also relates to a power semiconductor module comprising the electrical contact arrangement. The present invention also relates to a method for manufacturing a power semiconductor module with the electrical contact arrangement.

BACKGROUND ART

WO 2016/150583 A1 relates to a power semiconductor device, comprising a top side surface and a back side surface, wherein the back side surface is designed for connecting the power semiconductor device to a substrate metallization and wherein the top side surface is located opposite to the back side surface, wherein the top side surface comprises at least one migration barrier such, that at least one migration barrier at least partly forms the top side surface of the power semiconductor device.

SUMMARY OF INVENTION

It is an object of the present invention to provide an improved electrical contact arrangement and an improved power semiconductor module. For example, it is an object of the invention to provide a cheaper producible electrical contact arrangement and a cheaper producible power semiconductor module while reducing the occurrence of electrochemical migration and/or corrosion.

The object of the invention is solved by the features of the independent claims. Modified embodiments are detailed in the dependent claims.

According to a first aspect, the object is solved by an electrical contact arrangement for electrically contacting at least two power semiconductor devices of a power semiconductor module. The electrical contact arrangement comprises at least two bond wires and at least three electrical contacts, comprising an alternating current contact, a positive direct current contact, and a negative direct current contact, wherein each of the electrical contacts comprises a ground potential part; a contact part; and an insulation part for electrically insulating the ground potential part from the contact part, wherein the insulation part is provided on the ground potential part; and the contact part is provided on the insulation part, wherein at least two of the at least three electrical contacts are separated by having a gap between the insulation parts of the at least two separated electrical contacts and by having the gap between the contact parts of the at least two separated electrical contacts. At least one first bond wire connects a first power semiconductor device arranged on a contact part of the positive direct current contact with a contact part of the alternating current contact, and at least one second bond wire connects a second power semiconductor device arranged on the contact part of the alternating current contact with a contact part of the negative direct current contact.

The power semiconductor device may be a transistor, such as in insulated-gate bipolar transistor (IGBT). An IGBT is a semiconductor device used in power electronics, as it combines the advantages of a bipolar transistor, which are good on-state characteristics, high reverse voltage, robustness, and those of a field-effect transistor, such as a metal-oxide-semiconductor field-effect transistor, MOSFET, which is able to be controlled with minimal gate current.

A MOSFET is an active semiconductor device with at least three terminals, which are electrodes and comprise a gate, a drain, and a source. Regarding power MOSFETs, there are two designs, usually referred to as the planar and the trench MOSFETs. The trench MOSFET technology has the advantage of higher cell density. However, MOSFETs based on this technology are more difficult to manufacture than planar MOSFETs.

A power MOSFET is a specialized version of a metal oxide semiconductor field-effect transistor optimized for conducting and blocking large electrical currents and voltages being up to several hundred amperes and up to about 1000 volts, with a device volume of about one cubic centimeter.

The power semiconductor module provides an arrangement of several power semiconductor devices. These power semiconductor devices may be soldered or sintered on a power electronic substrate, which is a baseplate, and which carries the power semiconductor devices, provides electrical and thermal contact and electrical insulation where needed.

The ground potential part may comprise one or several layers of material and is arranged to ground the electrical contact to the baseplate of the semiconductor module. The insulation part electrically insulates the ground potential part from the electrical contact part. The insulation part and the contact part may be provided as separate layers, for example. The contact part is arranged to contact at least one power semiconductor device. The contact part may be made of a substrate. The contact part may be manufactured together with the insulation part. The contact part may be part of the insulation part, which means, for example, the contact part may be embedded into the insulation part, or completely arranged on the insulation part.

According to a second aspect, the object is also solved by a power semiconductor module comprising the electrical contact arrangement according to the first aspect. The electrical contact arrangement may be modified according to any of the modified embodiments referring to the electrical contact arrangement. The features of the power semiconductor module according to the second aspect may be modified according to the modified embodiments referring to the electrical contact arrangement.

According to a third aspect, the object is also solved by a method for manufacturing a power semiconductor module with an electrical contact arrangement for electrically contacting at least two power semiconductor device of the power semiconductor module, in particular the power semiconductor module according to the second aspect with the electrical contact arrangement according to the first aspect.

The electrical contact arrangement comprises at least two bond wires and at least three electrical contacts, comprising an alternating current contact, a positive direct current contact, and a negative direct current contact. The method comprises, for manufacturing at least three of the electrical contacts, steps of: manufacturing a ground potential part; manufacturing an insulation part on the ground potential part; and manufacturing a contact part on the insulation part, wherein at least two of the at least three electrical contacts are separated by having a gap between the insulation parts of the at least two separated electrical contacts and by having the gap between the contact parts of the at least two separated electrical contacts. The method further comprises: arranging a first power semiconductor device on a contact part of the positive direct current contact; connecting, using at least one first bond wire, the first power semiconductor device with a contact part of the alternating current contact; arranging a second power semiconductor device on the contact part of the alternating current contact; and connecting, using at least one second bond wire, the second power semiconductor device with a contact part of the negative direct current contact.

The features of the method according to the third aspect may be modified according to any of the features of the modified embodiments referring to the electrical contact arrangement.

An advantage of the invention as presented in all the above mentioned aspects is that the contact parts of different separated electrical contacts are separated to ensure that they are not provided on a same insulation part (or substrate part), but that the contact parts are provided on separate insulation parts (or substrate parts). Electrical connections between power semiconductor modules arranged on different electrical contact parts are established by one or more bond wires.

Thereby, the invention prevents or at least significantly slows down electrochemical migration in power semiconductor modules. This is achieved by applying a multi-substrate module design to eliminate substrate surface insulation gaps prone to migration of metals due to short pathways at high surface electric fields.

Another advantage of the electrical contact arrangement and the power semiconductor module according to the first and second aspect of the invention is that they can be easily retrofitted to module layouts according to the prior art and do not require any cost-intensive materials or otherwise risky design and manufacturing changes.

According to a modified embodiment, the insulation parts and the contact parts of any electrical contacts are positioned with the gap between each other. Thus, by this modified embodiment, the previously described advantages of the invention are provided for each of the electrical contacts of the power semiconductor module.

According to a modified embodiment, the insulation parts of any electrical contacts are positioned with the gap between each other and the contact parts of any electrical contacts are positioned with the gap between each other. This has the advantage of decoupling the grounding of the individual electrical contacts.

According to a modified embodiment, the ground potential parts of the separated electrical contacts are positioned with the gap between each other. This has the advantage of decoupling the grounding of the individual electrical contacts for each of the electrical contacts of the power semiconductor module. Alternatively, the ground potential parts of the electrical contacts may be connected or one-pieced, with other words there may be no gap between the ground potential parts.

According to a modified embodiment, the ground potential parts of any electrical contacts are positioned with the gap between each other. In other words, the electrical contact arrangement, at least, may comprise three electrical contacts being appropriate for several kinds of semiconductor modules having power semiconductor devices which do not need any further electrical contacts. An advantage of this modified embodiment is that a decoupling of the grounding of any electrical contacts is improved.

According to a modified embodiment, the electrical contact arrangement comprises at least or exactly five electrical contacts being an alternating current contact, a positive direct current contact, a negative direct current contact, a gate contact, and an auxiliary circuit contact. Thereby, the electrical contact arrangement is appropriate for semiconductor devices which need a control contact. Also, more complex circuits with auxiliary contacts may be realizable.

According to a modified embodiment, at least one of at least three or at least five electrical contacts is provided on another of the at least three or at least five electrical contacts. This would be an exemplary design for an electrical contact arrangement, where no power semiconductor device to be cooled is placed on the contact part of several of the electrical contacts. Herewith, more compact configurations of the electrical contact arrangement can be provided.

According to a modified embodiment, one of the at least three or the at least five electrical contacts is provided on one other of the at least three or the at least five electrical contacts. For example, the negative direct current contact may be provided on the alternating current contact, whereby, for example, the negative direct current contact may be provided on the contact part of the alternating current contact or on the insulation part of the alternating current contact.

According to one modified embodiment, the electrical contact arrangement comprises at least one electrical contact in form of a gate contact with a contact part in form of a gate contact part for contacting a gate of the at least one semiconductor device, wherein the gate contact part is provided on the insulation part of another electrical contact. For example, in case the contacted at least one semiconductor device is a high-side semiconductor device, the gate contact part may be provided on the insulation part of an alternating current contact. Alternatively, in case the contacted at least one semiconductor device is a low-side semiconductor device, the gate contact part may be provided on the insulation part of a negative direct current contact. According to another example, the gate contact part may be provided on an insulation part in form of a gate insulation part, wherein the gate insulation part is provided on the contact part of the at least one other electrical contact or the gate insulation part is provided on a contact part of an emitter contact.

The at least one semiconductor device in this context may be a transistor, for example an IGBT or a MOSFET.

According to one modified embodiment, the contact parts comprise at least one metallization area or the contact parts consist or are made of at least one metallization area. In this embodiment, the electrical contacts are positioned relative to each other to provide that the metallization areas of the electrical contacts are operable with a voltage potential difference of equal to or more than 100 V or two adjacent electrical contacts are positioned with the gap between the electrical contacts to provide that the metallization areas of the two adjacent electrical contacts are operable with a voltage potential difference of equal to or more than 100 V. This way, high voltage potential differences may be present without a high risk of electrochemical migration and/or corrosion. The contact parts of different separated electrical contacts may be separated to ensure that the separated contact parts are provided on separate insulation part, such that the at least one metallization may be free of insulation gaps.

According to one modified embodiment, the insulation part comprises or is made of a ceramic insulation material. The insulation part may comprise, may be made of/by or may be part of at least one of: direct-bonded copper substrate, an active metal brazing substrate, a direct bonded aluminum substrate, an insulated metal substrate, or a flexfoil technology.

According to one modified embodiment, the insulation part and the contact part are designed with a path length for electrically insulating and/or separating the ground potential part from the contact part of equal or more than 1 mm or equal or more than 3 mm. The insulation part and the contact part may be designed to provide a contact part free border of an edge of the insulation part having a path length for electrically insulating and/or separating the ground potential part from the contact part of equal or more than 1 mm.

According to one modified embodiment, the insulation part and the contact part of at least one electrical contact are designed to provide a migration path of an electrical field between the ground potential part and the contact part extending in at least two directions being perpendicular to each other. Thereby, a risk of electrochemical migration is further reduced.

BRIEF DESCRIPTION OF DRAWINGS

These and other aspects of the invention will be apparent from and elucidated with reference to the embodiments described hereinafter. In the figures, various instances of similar components are indicated by alphabetical suffixes. Additionally, similar references are used for elements with substantially similar functions, these elements, however, do not need to be identical in all details.

In the drawings.

DESCRIPTION OF EMBODIMENTS

Figure 1:
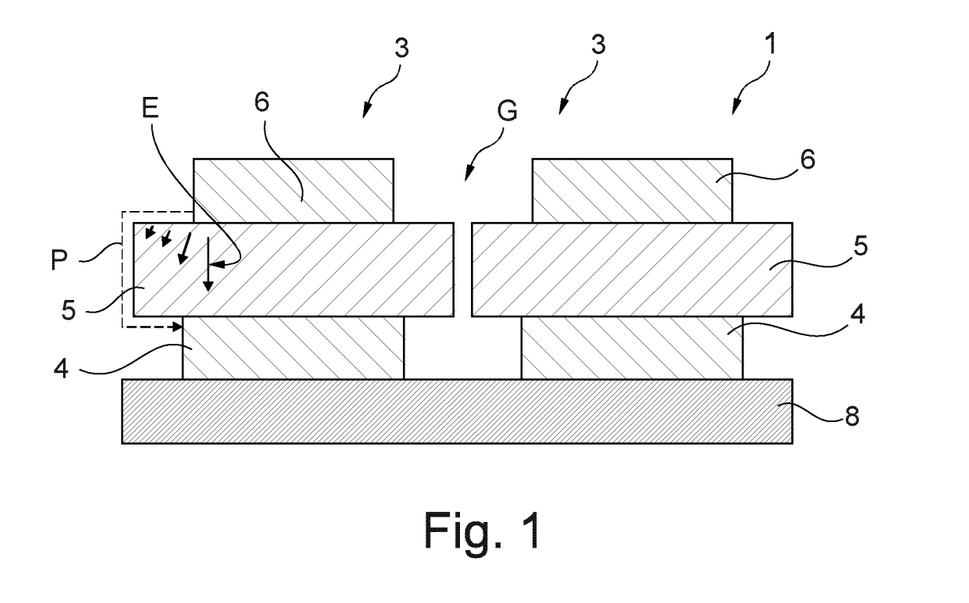
FIG. 1 shows a schematic cross-sectional view of an electrical contact arrangement for a semiconductor module.
Figure 4:
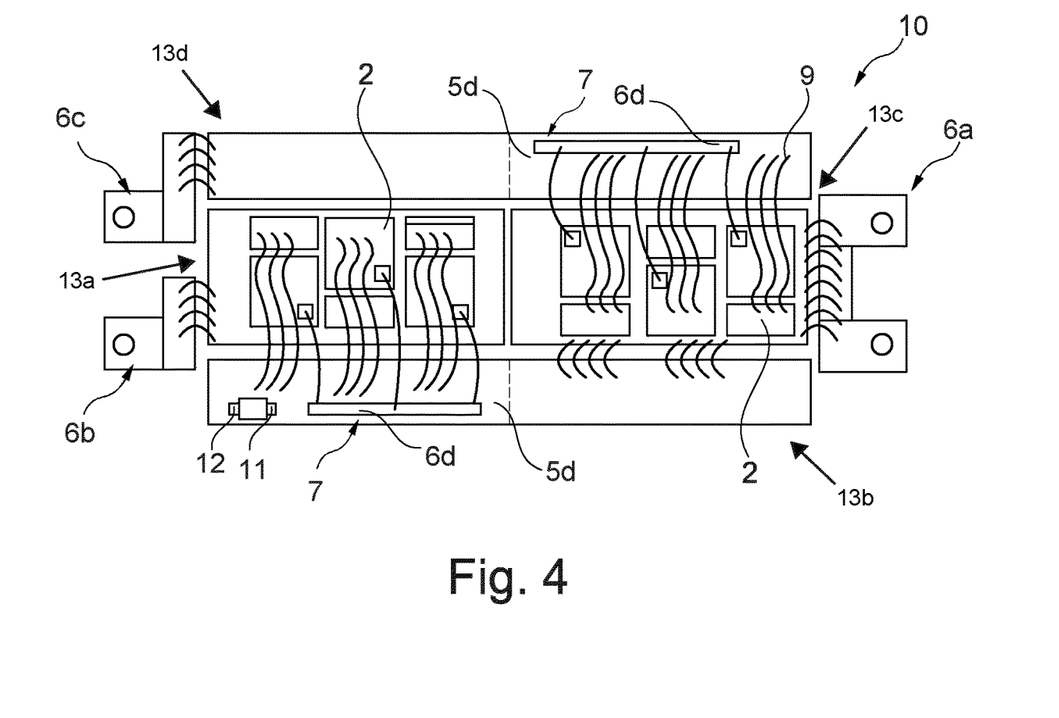
FIG. 4 shows a schematic top view of a power semiconductor module, according to an embodiment of the invention.

FIG. 1 shows an electrical contact arrangement 1 for a power semiconductor module, for example the power semiconductor module 10 as shown in FIG. 4. The electrical contact arrangement 1 is designed in a multi-substrate arrangement in order to provide, for example, reduced electrochemical migration.

The electrical contact arrangement 1 comprises a baseplate 8, on which two electrical contacts 3, each with a ground potential part 4, an insulation part 5 and a contact part 6 are arranged on the baseplate 8. The two electrical contacts 3 are spaced from one another by a gap G. In other words, the ground potential parts 4, the insulation parts 5 and the contact parts 6 of the electrical contacts are positioned with a gap G between each other on the baseplate 8.

By separating the two (or more) electrical contacts 3 into different parts of the multi-substrate arrangement, only one continuous contact part 6 (top-side metallization) is necessary for each respective part of the substrate. In other words, the contact part 6 of each electrical contact 3 corresponding to an electrical power terminal lie on a common electrical potential. However, further contact parts connected, e.g., to control terminals on a closely related electrical potential, such as a control gate voltage for a corresponding power terminal voltage, may be arranged on the same insulation part, i.e. the same part of the substrate. Typically, such terminals and corresponding module-internal electrical contacts will differ only by a relatively low potential difference, i.e. 15 V or less.

In contrast, in conventional power modules, multiple different power contact parts, i.e. for a positive direct current, a negative direct current and/or an alternating current, are typically arranged on a common insulation part, e.g. a common ceramic substrate. Thus, in conventional power modules, significantly different electrical potentials occur across the common ceramic substrate, leading to unwanted electrochemical migration across insulation gaps between the different contact parts of the metallization area. Accordingly, it is of advantage if a metallization area forming the contacts parts 6 is free of any insulation gaps.

The insulation part 5 is configured to electrically insulate the ground potential part 4 from the contact part 6 and the insulation part 5 is provided on the ground potential part 4. For illustration, some field lines of an electric field E, running through the insulation part 5, are shown in FIG. 1. The insulation part 5 and the contact part 6 are designed to provide a migration path between the ground potential part 4 and the contact part 6, extending in at least two directions being perpendicular to each other. In FIG. 1, a migration pathway P, or also called migration path P, is shown for illustration. The migration pathway P is the way of electrochemical migration between the contact part 6 and the ground potential part 4. By the arrangement of the electrical contacts 3 according to the invention, the length of the migration path P can be significantly increased.

It is noted that the described design of the electrical contacts 3 prevents or at least mitigates electrochemical migration of metal ions between neighboring contact parts, e.g. contact parts 6a and 6b. This is achieved in parts by the interruption of the insulation parts 5a and 5b carrying the contact parts 6a and 6b through the gap G. Thus no direct migration path exists between the contact parts 6a and 6b. Moreover, any indirect migration paths is considerably longer, as indicated by migration path P.

In addition, if the baseplate 8 is be connected to a reference electrical potential during operation, such as electrical ground, or a an electrical potential of a cooling arrangement, such as a heat spreader, the migration path P effectively ends at the ground potential part 4, as all ground potential parts 4 are on the same electrical potential, i.e. the potential of the baseplate 8.

Further, due to the geometric design of the electrical contacts 3, at least parts of the migration path P do not extend in parallel with the electrical field, causing electrochemical migration in the first place. Further, the electrical fields in two neighboring insulation parts, e.g. insulation parts 5a and 5b, may be directed in the same way, thus preventing an indirect migration of metal ions from one contact part, e.g. contact part 6a, to another contact part, e.g. contact part 6b.

In addition to the advantages with respect to undesired electrochemical migration, attention is drawn to the fact that, due to the provision of the gap G, the creepage path between neighboring contact parts, e.g. contact parts 6a and 6b, is also considerably increased, thus enabling better electrical isolation, in particular in wet or other uncontrolled environments.

Figure 2:
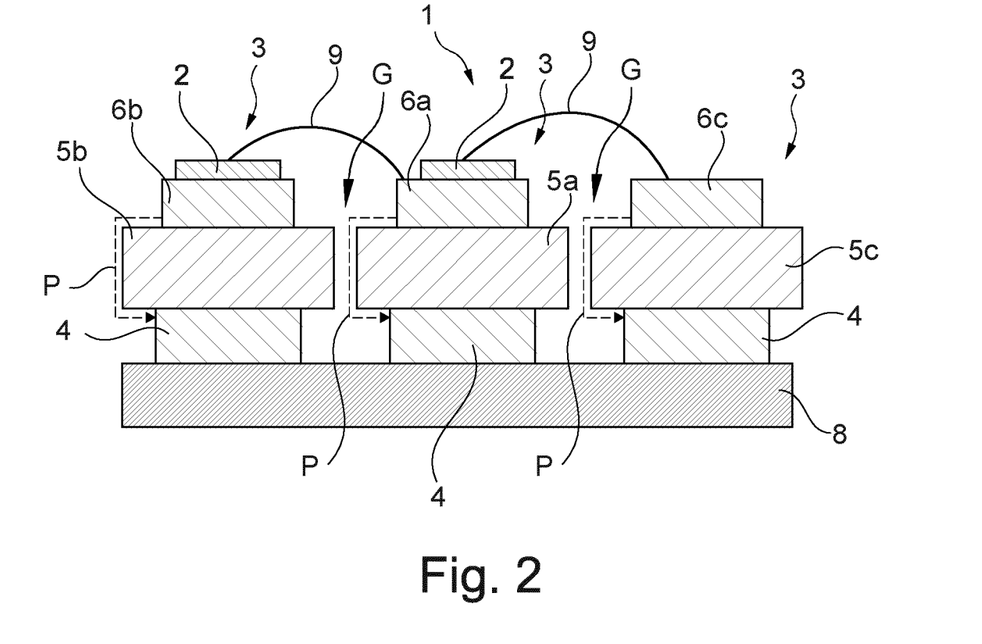
FIG. 2 shows a schematic cross-sectional view of an electrical contact arrangement for a power semiconductor module, according to an embodiment of the invention.

FIG. 2 shows a schematic cross-sectional view of an electrical contact arrangement 1 for a power semiconductor module, for example the power semiconductor module 10 as shown in FIG. 4, according to an embodiment of the invention. The electrical contact arrangement 1 comprises a baseplate 8, on which three electrical contacts 3, each with a ground potential part 4, an insulation part 5a, 5b, 5c and a contact part 6a, 6b, 6c are arranged with a gap G between each other. The electrical contacts 3 are an alternating current contact, a positive direct current contact and a negative direct current contact. The alternating current contact, which is shown in FIG. 2 as a middle electrical contact 3, comprises, besides the ground potential part 4 (not further specified with a letter), the insulation part 5a and the contact part 6a. The positive direct current contact, which is shown in FIG. 2 on the left, comprises, besides the ground potential part 4 (not further specified with a letter), the insulation part 5b and the contact part 6b. The negative direct current contact, which is shown in FIG. 2 on the right, comprises, besides the ground potential part 4 (not further specified with a letter), the insulation part 5c and the contact part 6c.

The alternating current contact and the positive direct current contact each have a power semiconductor device 2 arranged on their respective contact parts 6a, 6b. The power semiconductor device 2 on the positive direct current contact is connected via a bond wire 9 to the contact part 6a of the alternating current contact.

Furthermore, the power semiconductor device 2 on the alternating current contact is connected via another bond wire 9 to the contact part 6c of the negative direct current contact.

In other words, the ground potential part 4 of the alternating current contact, the insulation part 5a and the contact part 6a form a first substrate for the power semiconductor device 2 arranged directly on the alternating current contact. Correspondingly, the ground potential part 4 of the positive direct current contact, the insulation part 5b and the contact part 6b form a second substrate for the power semiconductor device 2 arranged directly on the positive direct current contact.

Moreover, features described with respect to the embodiment as shown in FIG. 1 correspondingly apply to the embodiment as shown in FIG. 2 and are not repeated herein again.

The arrangement of those electrical contacts 3 with the gap G between them, as described with reference to FIGS. 1 and 2, may apply to certain separated electrical contacts of an electrical contact arrangement or to all electrical contacts in an electrical contact arrangement.

Figure 3:
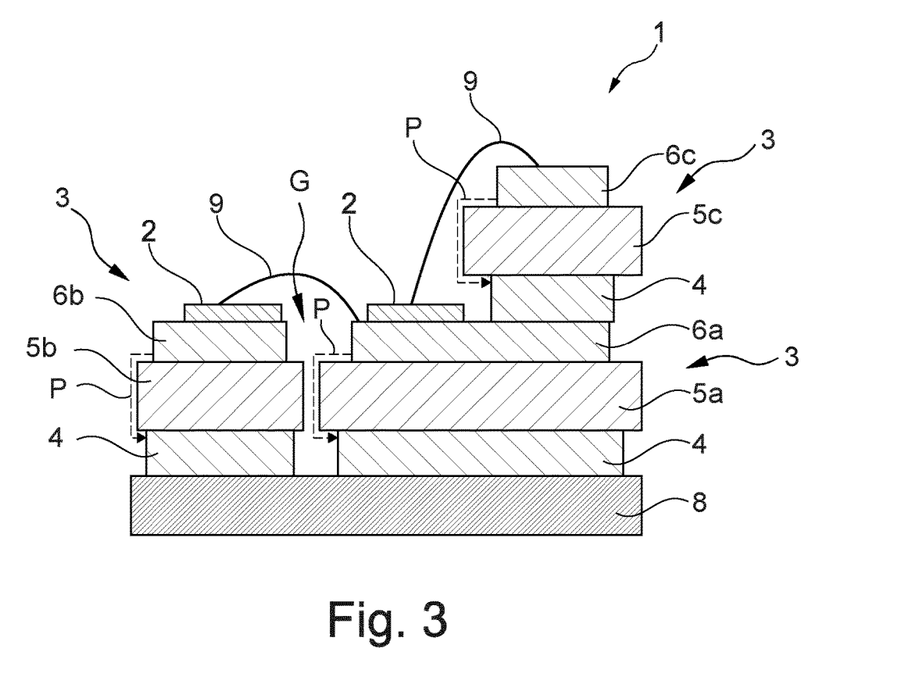
FIG. 3 shows a schematic cross-sectional view of an electrical contact arrangement for a power semiconductor module, according to a further embodiment of the invention.

FIG. 3 shows a schematic cross-sectional view of an electrical contact arrangement 1 for a power semiconductor module 10 according to a further embodiment of the invention.

The electrical contact arrangement 1 comprises a baseplate 8, on which two electrical contacts 3, each with a ground potential part 4 on top of the baseplate 8, an insulation part 5a, 5b and a contact part 6a, 6b are arranged with a gap G between each other. The electrical contacts 3 provided on the baseplate 8 are a positive direct current contact (in FIG. 3 shown on the left) and an alternating current contact (in FIG. 3 shown on the right).

Furthermore, another electrical contact 3, which is a negative direct current contact, is positioned on one of the other electrical contacts 3. Here, the negative direct current contact is arranged on the alternating current contact.

The alternating current contact comprises, besides the ground potential part 4 (not further specified with a letter), the insulation part 5a and the contact part 6a. The positive direct current contact comprises, besides the ground potential part 4 (not further specified with a letter), the insulation part 5b and the contact part 6b. The negative direct current contact comprises, besides the ground potential part 4 (not further specified with a letter), the insulation part 5c and the contact part 6c. The ground potential part 4 of the negative direct current contact is arranged on top of the contact part 6a of the alternating current contact. Alternatively, the ground potential part 4 of the negative direct current contact may be arranged on top of the insulation part 5a of the alternating current contact.

In operation, the electrical potential of the contact parts 6a and 6b will typically differ from electrical ground. Thus, the ground potential part 4 of the negative direct current contact may also be referred to as a "base potential part" or an "intermediate potential part". However, for easier reference, the term "ground potential part" will also be used for conductive parts of an electrical contact 3, which is stacked on top of another component, such as the alternating current contact or the positive direct current contact.

The insulation part 5c of the negative direct current contact is arranged on top of the ground potential part 4 of the negative direct current contact and the contact part 6c of the negative direct current contact is arranged on top of the insulation part 5c of the negative direct current contact.

The alternating current contact and the positive direct current contact each comprise a power semiconductor device 2 on their respective contact parts 6a, 6b. The power semiconductor device 2 on the positive direct current contact is connected via a bond wire 9 to the contact part 6a of the alternating current contact. Furthermore, the power semiconductor device 2 on the alternating current contact is connected via another bond wire 9 to the contact part 6c of the negative direct current contact.

In other words, a first power semiconductor device 2 is arranged on a top surface of a first substrate comprising the ground potential part 4 of the alternating current contact, the insulation part 5a and the contact part 6a. Correspondingly, a second power semiconductor device 2 is arranged on a top surface of a second substrate comprising the ground potential part 4 of the positive direct current contact, the insulation part 5b and the contact part 6b. The two substrates are separated from each other along their entire thickness by the gap G.

FIGS. 2 and 3 show electrical contact arrangements which comprise three electrical contacts. However, also further electrical contacts may be present, for example in addition to the three electrical contacts mentioned above, also a gate contact and/or an auxiliary circuit contact may be present, as described, for example, with respect to FIG. 4.

Moreover, features described with respect to the embodiments as shown in FIG. 1 and FIG. 2 correspondingly apply to the embodiment as shown in FIG. 3 and are not repeated herein again.

In the embodiments as sown in FIGS. 1 to 3, some or all of the insulation parts 5, 5a, 5b and 5c and some or all of the contact parts 6, 6a, 6b and 6c may be designed to define a migration pathway P length for electrically insulating and/or separating the ground potential parts 4 from the contact parts 6, 6a, 6b or 6c of equal or more than 1 mm or equal or more than 3 mm.

In the embodiments as shown in FIGS. 1 to 3, the insulation parts 5, 5a, 5b and 5c and the contact parts 6, 6a, 6b and 6c are designed to provide a contact part free border of an edge of the insulation part 5, 5a, 5b or 5c facing away from the baseplate 8 having a path length for electrically insulating and/or separating the ground potential part 4 from the contact part 6, 6a, 6b, 6c or 6d of equal or more than 1 mm. In those embodiments, also the ground potential parts 4 are designed to provide a contact part free border of an edge of the insulation part 5, 5a, 5b or 5c facing towards the baseplate 8. Hence the gap G has different widths between the contact parts 6, 6a, 6b and 6c, the insulation parts 5, 5a, 5b and 5c and the ground potential parts 4. Alternative designs in that regard are, of course, also possible.

In other words, in the depicted embodiments, the insulation part 5, 5a, 5b or 5c protrude in a plane parallel to the baseplate 8, from the respective contact parts 6, 6a, 6b and 6c by a first distance, and from the respective ground potential parts 4 by a second distance. The first and second distances may be the same or may be different, and may be equal or larger than 1 mm for typical power electronics applications. The thickness of the insulation part 5, 5a, 5b or 5c may be the same or different as the first and/or second distance, and may be equal or larger than 1 mm for typical power electronics applications.

FIG. 4 shows a schematic top view of a power semiconductor module 10 according to an embodiment of the invention.

The power semiconductor module 10 comprises an alternating current contact 3a with a contact part 6a, a positive direct current contact 3b with a contact part 6b, a negative direct current contact 3c with a contact part 6c, and two gate contacts 7 with gate contact parts 6d. Each of the contacts may be configured as one of the electrical contacts 3 described above, i.e. comprise a contact part (only shown for the gate contacts 7), a separate insulation part (only insulation part 5d shown), and a base contact portion (not shown). Together, the respective ground potential part, the insulation part and the contact part form respective substrates of the power semiconductor module 10. The individual substrates may be arranged on a common baseplate (not shown), as detailed above with respect to FIG. 1.

Furthermore, several power semiconductor devices 2 are provided. The power semiconductor devices 2 are connected via bond wires 9 to the contact parts 6a, 6b, 6c and the gate contact parts 6d and/or other contact parts of the respective substrates. Furthermore, a thermistor, with a negative temperature coefficient (NTC) in port 11 and an NTC out port 12, is shown.

In this embodiment, high side power semiconductor devices 2 are arranged on a first substrate 13a that is connected via first bond wires to the contact part 6b of the positive direct current contact. Gate lines of the high side power semiconductor devices 2 are arranged on a second substrate 13b that is connected, e.g. via second bond wires, to the alternating current potential, i.e. that is connected to a third substrate 13c which in turn is connected to the contact part 6a of the alternating current contact.

Low side power semiconductor devices 2 are arranged on third substrate 13c that is connected via third bond wires to the contact part 6a of the alternating direct current contact. Gate lines of the low side power semiconductor devices 2 are arranged on a fourth substrate 13d that is connected to the positive direct current potential, i.e. that is connected, e.g. via fourth bond wires, to the contact part 6c of the negative direct current contact. This ensures that a potential difference across insulation gaps, e.g. between the gate contact parts 6d and other contact parts of the second and fourth substrate, range up to a maximum of +/−15 Volts, thereby reducing a risk of electrochemical migration.

As shown in FIG. 4, in the described embodiment, the gate lines and corresponding gate contact parts 6d are arranged on metallization islands on a substrate also carrying the bulk current of the semiconductor module, which may result in a small amount of electrochemical migration between the respective metallization parts. To avoid all migration and/or to further increase a creepage distance, the gate lines and corresponding gate contact parts 6d may also be formed on separate substrate parts (not shown).

In more detail, the power semiconductor module 10 forms a half bridge, with multiple power semiconductor devices 2, such as IBGTs, (MOS-)FETs, and diodes, arranged on respective conductive parts (not shown) of the first and second substrates. Each power semiconductor devices 2 has a first power terminal on its mounting surface, i.e. in electrical contact with the respective conductive parts of the contact it is arranged on, and a second power terminal on its opposite surface, i.e. the surface facing away from the mounting surface.

The second power terminals of the low and high side power semiconductor devices 2 are connected with a contact part (not shown) of another substrate using bond wires 9, which bridge the corresponding difference in electrical potential between the respective substrate parts. In the depicted embodiment, the low and high side power semiconductor devices 2 are connected via bond wires 9 with respective contact parts (not shown) of the second substrate 13b and fourth substrate 13d, respectively. In other embodiments, they may be directly connected with contact parts of other electrical contacts, such as the contact parts 6a and 6c of the embodiments described with respect to FIGS. 2 and 3.

In more detail, each one of the first and third substrates 13a and 13b comprises a single conductive part, i.e. a top side metallization, on which three groups of semiconductor devices 2 are arranged, thereby connecting their lower, first power terminal to a common electrical potential. In the described embodiment, the high side power semiconductor devices 2 are arranged on a conductive part of the first substrate 13a connected with the positive direct current potential, and the low side power semiconductor devices 2 are arranged on a conductive part of the third substrate 13c connected with the alternating current potential. Each group comprises an IGBT (large square shape with gate terminal on top in FIG. 4), and a freewheeling diode (smaller, rectangular shape in FIG. 4). The upper, second power terminals of each group are connected in parallel and with a top side metallization of the second and third substrates 13b and 13d, respectively, using multiple stitched bond wires 9.

In addition, in the depicted embodiments, each active power semiconductor device 2 has a control or auxiliary gate terminal, which may be controlled by a control voltage provided via the respective gate contact 7 with gate contact part 6d. The contact parts 6d of the gate contacts 7 may be arranged on the same insulating part 5d as the contact part for connecting the second power terminal, or may be stacked as indicated above with respect to FIG. 3. In case the power semiconductor devices 2 are power diodes, the control or auxiliary gate terminals and corresponding gate contacts 7 may be omitted. Other types of auxiliary contacts may comprise one or more electrical contacts of a temperature sensor or an emitter contact, which may be used for short-circuit sensing.

The embodiment of FIG. 4 shows the power semiconductor module 10 as a 4-substrate version with an enhanced robustness against electrochemical migration. The substrates 13a to 13d corresponding to different potentials in this embodiment are spaced from one another.

Referring to the figure one can see that a very simple and straight-forward retrofit of existing power modules is possible. All the basic chip arrangements and power circuit lines can be kept almost identical. Depending on the arrangement, it may be necessary to provide a little more space between the individual substrates, and some rearrangement of bond wires may be required when applying rectangular substrates. In the embodiment, all shown insulation parts (here, the insulation part 5d) are rectangular. As an alternative to a rectangular insulation part it is also an option to apply L-shaped or otherwise shaped insulation parts, for example.

With respect to all the above-mentioned embodiments of the electrical contact arrangement 1 and the power semiconductor module 10 as described with reference to FIGS. 1 to 4, the contact parts 6, 6a, 6b, 6c and 6d comprise at least one metallization area or consist or are made of at least one metallization area. The electrical contacts 3 or 7 are positioned relative to each other to provide that the metallization areas of the electrical contacts 3 or 7 are operable with a voltage potential difference of equal to or more than 100 V or two adjacent electrical contacts 3 or 7 are positioned with the gap G between the electrical contacts 3 or 7 to provide that the metallization areas of the two adjacent electrical contacts 3 or 7 are operable with a voltage potential difference of equal to or more than 100 V. This way, high voltage potential differences may be present without a high risk of electrochemical migration and/or corrosion. The at least one metallization may be free of insulation gaps.

Each of the insulation parts 5, 5a, 5b, 5c and 5d may comprise or may be made of a ceramic insulation material (e.g., an insulation layer of a direct-bonded copper substrate, an active metal brazing substrate, or a direct bonded aluminum substrate) or may be based on a substrate with polymeric insulation (e.g., insulated metal substrate, printed circuit board, or flex foil). Finally, it shall be mentioned that the approach of this invention can of course also be combined with other known measures to reduce electrochemical migration. These can be protective coatings, such as parylene, ALD ceramic layers, etc., or over-plating of metallization tracks with less active metals, such as Au, Pd, Ni, or application of encapsulation materials with low water uptake and low water vapor diffusion, such as epoxy mold compounds, or hydroset ceramics.

While the invention has been described with regard to a power module implementing a half-bridge comprising at least three electrical contacts and corresponding power terminals, and at least two power semiconductor devices, the disclosed approach can also be applied in a power module implementing a switch configuration, comprising only two electrical contacts and corresponding power terminals, and at least one power semiconductor devices.

The present disclosure also comprises the following embodiments:

Embodiment 1: An electrical contact arrangement (1) for electrically contacting at least one power semiconductor device (2) of a power semiconductor module (10),
the electrical contact arrangement (1) comprising at least two electrical contacts (3, 7),
wherein each of the electrical contacts (3, 7) comprises a ground potential part (4);
a contact part (6, 6a, 6b, 6c, 6d); and
an insulation part (5, 5a, 5b, 5c, 5d) for electrically insulating the ground potential part (4) from the contact part (6, 6a, 6b, 6c, 6d),
wherein the insulation part (5, 5a, 5b, 5c, 5d) is provided on the ground potential part (4); and
the contact part (6, 6a, 6b, 6c, 6d) is provided on the insulation part (5, 5a, 5b, 5c, 5d),
wherein at least two electrical contacts (3, 7) are separated by having a gap (G) between the insulation parts (5, 5a, 5b, 5c, 5d) of the separated electrical contacts (3, 7) and by having the gap (G) between the contact parts (6, 6a, 6b, 6c, 6d) of the separated electrical contacts (3, 7).

Embodiment 2: The electrical contact arrangement (1) according to the preceding embodiment,
wherein the insulation parts (5, 5a, 5b, 5c, 5d) of any electrical contacts (3, 7) are positioned with the gap (G) between each other and
the contact parts (6, 6a, 6b, 6c, 6d) of any electrical contacts (3, 7) are positioned with the gap (G) between each other.

Embodiment 3: The electrical contact arrangement (1) according to embodiment 1 or 2,
wherein the ground potential parts (4) of the separated electrical contacts (3, 7) are positioned with the gap (G) between each other, or
wherein the ground potential parts (4) of any electrical contacts (3, 7) are positioned with the gap (G) between each other.

Embodiment 4: The electrical contact arrangement (1) according to any of the preceding embodiments,
comprising at least three electrical contacts (3, 7) being an alternating current contact, a positive direct current contact and a negative direct current contact; or
comprising at least five electrical contacts (3, 7) being an alternating current contact, a positive direct current contact, a negative direct current contact, a gate contact, and an auxiliary circuit contact.

Embodiment 5: The electrical contact arrangement (1) according to embodiment 4,
wherein at least one of the at least three or the at least five electrical contacts (3, 7) is provided on another of the at least three or the at least five electrical contacts (3, 7); or
wherein one of the at least three or the at least five electrical contacts (3, 7) is provided on one other of the at least three or the at least five electrical contacts (3, 7); or
wherein the negative direct current contact is provided on the alternating current contact; or
wherein the negative direct current contact is provided on the contact part (6a) of the alternating current contact or on the insulation part (5a) of the alternating current contact.

Embodiment 6: The electrical contact arrangement (1) according to any of the preceding embodiments,
comprising at least one electrical contact (7) in form of a gate contact (7) with a contact part in form of a gate contact part (6d) for contacting a gate of the at least one semiconductor device (2), wherein the gate contact part (6d) is provided on the insulation part (5, 5a, 5b, 5c) of another electrical contact (3);

or
    comprising at least one electrical contact (7) in form of a gate contact (7) with a contact part in form of a gate contact part (6d) for contacting a gate of the at least one semiconductor device (2),
    wherein in case the contacted at least one semiconductor device is a high-side semiconductor device, the gate contact part (6d) is provided on the insulation part (5a) of an alternating current contact (6a); and/or
    comprising at least one electrical contact (7) in form of a gate contact (7) with a contact part in form of a gate contact part (6d) for contacting a gate of the at least one semiconductor device (2),
    wherein in case the contacted at least one semiconductor device is a lowside semiconductor device, the gate contact part (6d) is provided on the insulation part (5c) of a negative direct current contact (6c);
or
    comprising at least one electrical contact (7) in form of a gate contact (7) with a contact part in form of a gate contact part (6d) for contacting a gate of the at least one semiconductor device (2),
    wherein the gate contact part (6d) is provided on an insulation part (5d) in form of a gate insulation part,
    and the gate insulation part (5d) is provided on the contact part (6, 6a, 6b, 6c) of the at least one other electrical contact (3);
or
    comprising at least one electrical contact (7) in form of a gate contact (7) with a contact part in form of a gate contact part (6d) for contacting a gate of the at least one semiconductor device (2),
    wherein the gate contact part (6d) is provided on an insulation part (5d) in form of a gate insulation part,
    and the gate insulation part (5d) is provided on a contact part (6a) of an emitter contact.

Embodiment 7: The electrical contact arrangement (1) according to any of the preceding embodiments,
    wherein the contact parts (6, 6a, 6b, 6c, 6d) comprise at least one metallization area; or
    wherein the contact parts (6, 6a, 6b, 6c, 6d) are made of at least one metallization area;
    wherein the electrical contacts (3, 7) are positioned relative to each other to provide that the metallization areas of the electrical contacts (3, 7) are operable with a voltage potential difference of equal or more than 100 V; or
    wherein two adjacent electrical contacts (3, 7) are positioned with the gap (G) between the electrical contacts (3, 7) to provide that the metallization areas of the two adjacent electrical contacts (3, 7) are operable with a voltage potential difference of equal or more than 100 V.

Embodiment 8: The electrical contact arrangement (1) according to embodiment 7, wherein the at least one metallization area is free of insulation gaps.

Embodiment 9: The electrical contact arrangement (1) according to any of the preceding embodiments,
    wherein the insulation part (5, 5a, 5b, 5c, 5d) comprises or is made of a ceramic insulation material; or
    wherein the insulation part (5, 5a, 5b, 5c, 5d) comprises or is made of/by at least one of: direct-bonded copper substrate, an active metal brazing substrate, a direct bonded aluminum substrate, an insulated metal substrate, a flexfoil technology.

Embodiment 10: The electrical contact arrangement (1) according to any of the preceding embodiments,
    wherein the insulation part (5, 5a, 5b, 5c, 5d) and the contact part (6, 6a, 6b, 6c, 6d) are designed with a path length for electrically insulating the ground potential part (4) from the contact part (6, 6a, 6b, 6c, 6d) of equal or more than 1 mm or equal or more than 3 mm, or
    wherein the insulation part (5, 5a, 5b, 5c, 5d) and the contact part (6, 6a, 6b, 6c, 6d) are designed to provide a contact part free border of an edge of the insulation part (5, 5a, 5b, 5c, 5d) having a path length for electrically insulating the ground potential part (4) from the contact part (6, 6a, 6b, 6c, 6d) of equal or more than 1 mm.

Embodiment 11: The electrical contact arrangement (1) according to any of the preceding embodiments,
    wherein the insulation part (5, 5a, 5 b, 5c, 5d) and the contact part (6, 6a, 6b, 6c, 6d) are designed to provide a migration path of an electrical field (E) between the ground potential part (4) and the contact part (6, 6a, 6b, 6c, 6d) extending in at least two directions being perpendicular to each other.

Embodiment 12: A power semiconductor module (10), comprising the electrical contact arrangement (1) according to any of the preceding embodiments.

Embodiment 13: A method for manufacturing an electrical contact arrangement (1) for electrically contacting at least one power semiconductor device (2) of a power semiconductor module (10),
    the electrical contact arrangement (1) comprising at least two electrical contacts (3, 7),
    the method comprises, for manufacturing at least two of the electrical contacts (3, 7), steps of:
    manufacturing a ground potential part (4);
    manufacturing an insulation part (5, 5a, 5b, 5c, 5d) on the ground potential part (4); and
    manufacturing a contact part (6, 6a, 6b, 6c, 6d) on the insulation part (5, 5a, 5b, 5c, 5d),
    wherein at least two electrical contacts (3, 7) are manufactured to be separated by having a gap (G) between the insulation parts (5, 5a, 5b, 5c, 5d) of the separated electrical contacts (3, 7) and by having the gap (G) between the contact parts (6, 6a, 6b, 6c, 6d) of the separated electrical contacts (3, 7).

Embodiment 14: A method for manufacturing a power semiconductor module (10) with the electrical contact arrangement (1) according to any of the preceding embodiments 1 to 10,
    the method comprising the steps of the method according to embodiment 13 and manufacturing at least one power semiconductor device (2); and electrically connecting the power semiconductor device (2) with the electrical contact arrangement (1).

Embodiment 15: An electrical contact arrangement (1) for electrically contacting at least one power semiconductor devices (2), in particular a power semiconductor switching device, of a power semiconductor module (10),
    the electrical contact arrangement (1) comprising at least one bond wire (9) and at least two electrical contacts,
    wherein each of the electrical contacts (3) comprises
        a ground potential part (4);
        a contact part (6a, 6b, 6c); and
        an insulation part (5a, 5b, 5c) for electrically insulating the ground potential part (4) from the contact part (6a, 6b, 6c),
        wherein the insulation part (5a, 5b, 5c) is provided on the ground potential part (4); and the contact part (6a, 6b, 6c) is provided on the insulation part (5a, 5b, 5c), wherein the least two electrical contacts (3) are separated by having a gap (G) between the insulation parts (5a, 5b, 5c) of the at least two separated electrical contacts (3) and by having the gap (G) between the contact parts (6a, 6b, 6c) of the at least two separated electrical contacts (3); and wherein the at least one bond wire (9) connects the at least one semiconductor device (2) arranged on a first contact part (6b) of a first electrical contact (3) of the at least two electrical contacts with a second contact part (6a) of a second electrical contact (3) of the at least two electrical contacts.

While the invention has been illustrated and described in detail in the drawings and foregoing description, such illustration and description are to be considered illustrative or exemplary and not restrictive; the invention is not limited to the disclosed embodiments. Other variations to be disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting scope.

REFERENCE SIGNS LIST 1 electrical contact arrangement
2 power semiconductor device
3 electrical contact
4 ground potential part
5 insulation part
5a insulation part of alternating current contact
5b insulation part of positive direct current contact
5c insulation part of negative direct current contact
5d insulation part of gate contact
6 contact part
6a contact part of alternating current contact
6b contact part of positive direct current contact
6c contact part of negative direct current contact
6d gate contact part
7 gate contact
8 base plate
9 bond wire
10 power semiconductor module
11 NTC in port
12 NTC out port
13 substrate
E electrical field
G gap
P migration path

The invention claimed is:

1. An electrical contact arrangement for electrically contacting at least two power semiconductor devices of a power semiconductor module, the electrical contact arrangement comprising at least two bond wires and at least three electrical contacts, comprising an alternating current contact, a positive direct current contact, and a negative direct current contact, wherein each of the electrical contacts comprises
a ground potential part;
a contact part; and
an insulation part for electrically insulating the ground potential part from the contact part, wherein the insulation part is provided on the ground potential part; and the contact part is provided on the insulation part, wherein at least two of the at least three electrical contacts are separated by having a gap between the insulation parts of the at least two separated electrical contacts and by having the gap between the contact parts of the at least two separated electrical contacts; and wherein at least one first bond wire connects a first power semiconductor device arranged on a contact part of the positive direct current contact with a contact part of the alternating current contact, and at least one second bond wire connects a second power semiconductor device arranged on the contact part of the alternating current contact with a contact part of the negative direct current contact.

2. The electrical contact arrangement according to claim 1,
wherein each one of the at least two separated electrical contacts comprises a separate substrate, each separate substrate comprising the ground potential part, the contact part, and the insulation part of the respective electrical contact; and
wherein the at least two separate substrates are arranged on a common baseplate.

3. The electrical contact arrangement according to claim 1, wherein the at least one first bond wire directly connects the first power semiconductor device arranged on the contact part of the positive direct current contact with the contact part of the alternating current contact, and/or the at least one second bond wire directly connects the second power semiconductor device arranged on the contact part of the alternating current contact with the contact part of the negative direct current contact.

4. The electrical contact arrangement according to claim 1, wherein the insulation parts of any electrical contacts are positioned with the gap between each other and the contact parts of any electrical contacts are positioned with the gap between each other.

5. The electrical contact arrangement according to claim 1,
wherein the ground potential parts of the at least two separated electrical contacts are positioned with the gap between each other, or
wherein the ground potential parts of any electrical contacts are positioned with the gap between each other.

6. The electrical contact arrangement according to claim 1, comprising at least five electrical contacts further comprising at least one of a gate contact, and an auxiliary circuit contact.

7. The electrical contact arrangement according to claim 6,
wherein at least one of the at least three or the at least five electrical contacts is provided on another of the at least three or the at least five electrical contacts; or
wherein one of the at least three or the at least five electrical contacts is provided on one other of the at least three or the at least five electrical contacts; or
wherein the negative direct current contact is provided on the alternating current contact; or wherein the negative direct current contact is provided on the contact part of the alternating current contact or on the insulation part of the alternating current contact.

8. The electrical contact arrangement according to claim 6, comprising at least one electrical contact in form of a gate contact with a contact part in form of a gate contact part for contacting a gate of the at least one semiconductor device, wherein the gate contact part is provided on the insulation part of another electrical contact.

9. The electrical contact arrangement according to claim 1,
wherein the contact parts comprise at least one metallization area; or
wherein the contact parts are made of at least one metallization area;
wherein the electrical contacts are positioned relative to each other to provide that the metallization areas of the electrical contacts are operable with a voltage potential difference of equal or more than 100 V; or
wherein two adjacent electrical contacts are positioned with the gap between the electrical contacts to provide that the metallization areas of the two adjacent electrical contacts are operable with a voltage potential difference of equal or more than 100 V; and/or
wherein the contact parts of different separated electrical contacts are separated to ensure that the separated contact parts are provided on separate insulation part, such that the at least one metallization area is free of insulation gaps.

10. The electrical contact arrangement according to claim 1,
wherein the insulation part comprises or is made of a ceramic insulation material; or
wherein the insulation part comprises, is made of/by or is part of at least one of: direct-bonded copper substrate, an active metal brazing substrate, a direct bonded aluminum substrate, an insulated metal substrate, or a flexfoil technology.

11. The electrical contact arrangement according to claim 1,
wherein the insulation part and the contact part are designed with a path length for electrically insulating and/or separating the ground potential part from the contact part of equal or more than 1 mm or equal or more than 3 mm, or
wherein the insulation part and the contact part are designed to provide a contact part free border of an edge of the insulation part having a path length for electrically insulating and/or separating the ground potential part from the contact part of equal or more than 1 mm.

12. The electrical contact arrangement according to claim 1, wherein the insulation part and the contact part are designed to provide a migration path between the ground potential part and the contact part extending in at least two directions being perpendicular to each other.

13. A power semiconductor module, comprising the electrical contact arrangement according to claim 1.

14. The power semiconductor module of claim 13, comprising:
multiple power semiconductor devices, comprising high side power semiconductor devices and low side power semiconductor devices;
an alternating current contact with one or more contact parts;
a positive direct current contact with one or more contact parts;
a negative direct current contact with one or more contact parts; and
two gate contacts with corresponding gate contact parts; wherein
each of the contact parts is arranged on a separate insulation part;
the high side power semiconductor devices are arranged on a first substrate that is connected via bond wires to a contact part of the positive direct current contact;
gate lines of the high side power semiconductor devices are arranged on a second substrate that is connected via bond wires to a third substrate;
the low side power semiconductor devices are arranged on the third substrate that is connected via bond wires to a contact part of the alternating direct current contact;
gate lines of low side power semiconductor devices are arranged on a fourth substrate that is connected via bond wires to a contact part of the negative direct current contact; and
the first to fourth substrates are spaced from one another.

15. A method for manufacturing a power semiconductor module with an electrical contact arrangement for electrically contacting at least two power semiconductor device of the power semiconductor module of claim 13,
wherein the electrical contact arrangement comprising at least two bond wires and at least three electrical contacts, comprising an alternating current contact, a positive direct current contact, and a negative direct current contact,
wherein the method comprises, for manufacturing at least three of the electrical contacts , the steps of:
manufacturing a ground potential part;
manufacturing an insulation part on the ground potential part; and
manufacturing a contact part on the insulation part,
wherein at least two of the at least three electrical contacts are manufactured to be separated by having a gap between the insulation parts of the at least two separated electrical contacts and by having the gap between the contact parts of the at least two separated electrical contacts; and
wherein the method further comprises:
arranging a first power semiconductor device on a contact part of the positive direct current contact;
connecting, using at least one first bond wire, the first power semi-conductor device with a contact part of the alternating current contact;
arranging a second power semiconductor device on the contact part of the alternating current contact; and
connecting, using at least one second bond wire, the second power semiconductor device with a contact part of the negative direct current contact.

16. The electrical contact arrangement according to claim 1, wherein the at least one first bond wire connects the first power semiconductor device to a further first contact part arranged on a further insulation part, the first contact part being connected with the contact part of the alternating current contact, and/or the at least one second bond wire connects the second power semiconductor device to a further second contact part arranged on a further insulation part, the second contact part being connected with the contact part of the negative direct current contact.

17. The electrical contact arrangement according to claim 6, comprising at least one electrical contact in form of a gate contact with a contact part in form of a gate contact part for contacting a gate of the at least one semiconductor device, wherein in case the contacted at least one semiconductor device is a high-side semiconductor device, the gate contact part is provided on the insulation part of an alternating current contact.

18. The electrical contact arrangement according to claim 6, comprising at least one electrical contact in form of a gate contact with a contact part in form of a gate contact part for contacting a gate of the at least one semiconductor device, wherein in case the contacted at least one semiconductor device is a low-side semiconductor device, the gate contact part is provided on the insulation part of a negative direct current contact.

19. The electrical contact arrangement according to claim 6, comprising at least one electrical contact in form of a gate contact with a contact part in form of a gate contact part for contacting a gate of the at least one semiconductor device, wherein the gate contact part is provided on an insulation part in form of a gate insulation part, and the gate insulation part is provided on the contact part of the at least one other electrical contact.

20. The electrical contact arrangement according to claim 6, comprising at least one electrical contact in form of a gate contact with a contact part in form of a gate contact part for contacting a gate of the at least one semiconductor device, wherein the gate contact part is provided on an insulation part in form of a gate insulation part, and the gate insulation part is provided on a contact part of an emitter contact.

* * * * *